(12) United States Patent
Nagaraj et al.

(10) Patent No.: US 6,597,302 B2
(45) Date of Patent: Jul. 22, 2003

(54) SYSTEM FOR INCREASING THE BANDWIDTH OF SAMPLE-AND-HOLD CIRCUITS IN FLASH ADCS

(75) Inventors: Krishnasawamy Nagaraj, Somerville, NJ (US); David A. Martin, Atlantic Highlands, NJ (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/032,645

(22) Filed: Oct. 29, 2001

(65) Prior Publication Data

US 2002/0097177 A1 Jul. 25, 2002

Related U.S. Application Data

(60) Provisional application No. 60/253,901, filed on Nov. 29, 2000.

(51) Int. Cl.[7] .............................................. H03M 1/12
(52) U.S. Cl. ........................ 341/155; 341/156; 341/158; 341/159
(58) Field of Search .................................. 341/155, 156, 341/122, 154, 136, 158, 120, 159

(56) References Cited

U.S. PATENT DOCUMENTS

| | | | | |
|---|---|---|---|---|
| 4,183,016 A | * | 1/1980 | Sawagata | 341/122 |
| 5,450,085 A | * | 9/1995 | Stewart et al. | 341/159 |
| 5,534,864 A | * | 7/1996 | Ono et al. | 341/156 |
| 6,369,743 B2 | * | 4/2002 | Ono | 341/159 |
| 2002/0063982 A1 | * | 5/2002 | Kim et al. | 360/26 |
| 2002/0079852 A1 | * | 6/2002 | Menegoli | 318/254 |
| 2002/0085305 A1 | * | 7/2002 | Asano et al. | 360/78 |

* cited by examiner

*Primary Examiner*—Michael Tokar
*Assistant Examiner*—John Nguyen
(74) *Attorney, Agent, or Firm*—W. Daniel Swayze, Jr.; W. James Brady; Frederick J. Telecky, Jr.

(57) ABSTRACT

An analog-to-digital converter to convert an analog signal to a digital signal, including a sample-and-hold circuit to sample and hold the analog signal and to output a held signal, a buffer circuit to buffer the held signal to output a buffered signal, and a comparator circuit to compare the buffered signal with a reference voltage.

7 Claims, 3 Drawing Sheets

SYSTEM FOR INCREASING THE BANDWIDTH OF SAMPLE-AND-HOLD CIRCUITS IN FLASH ADCS

This application claims priority under 35 USC §119(e)(1) of provisional application Serial No. 60/253,901, filed Nov. 29, 2000.

FIELD OF THE INVENTION

The present invention relates to analog-to-digital converters and particularly to analog-to-digital converters having a very high operating clock frequency.

BACKGROUND OF THE INVENTION

Conventional high-speed, analog-to-digital converters ("ADCs") commonly employ a full flash architecture in which the analog-to-digital conversion is done in parallel by using approximately $2^N$ voltage comparators. An input voltage and fractional portions of a reference voltage are applied simultaneously to each comparator. The fractional portions of the reference voltage are obtained by dividing the reference voltage into equal increments by resistors. The output of each comparator is generally applied to a decoder which decodes such received inputs into a multi-bit digital output representative of the input voltage.

A block diagram of a flash ADC is illustrated in FIG. 5. One problem with such ADCs is that the comparators of the ADCs can have large offsets which generate errors in the digital output. During the auto-zero cycle, the comparator's output is connected to its input through switch 1702. The capacitor 1704 is connected to the resistance ladder 1706 through switch 1712 instead of the output of the sample-and-hold circuit 1710. This stores both the reference level and the offset information on the capacitor 1704 so that the sample-and-hold circuit 1710 is reconnected to the capacitor 1704 through switch 1708. The input to the comparator 1714 is now equal to the output of the sample-and-hold circuit 1710 minus the reference voltage and minus the comparator offset. One problem with the technique corresponding to the circuit illustrated in FIG. 5 is that the switch 1708 connecting the sample-and-hold circuit 1710 to the coupling capacitor 1704 forms a low-pass RC filter with the input capacitance of the comparator 1714. This limits the bandwidth of the sample-and-hold circuit 1710. One solution to this problem is to use a pass transistor with a high width-to-length ratio and a high gate drive. However, with a low supply voltage that are currently available, this becomes more difficult. With an ADC to operate in the 1 Gbit range, this solution has been identified as one of the bottlenecks that ultimately limits the speed of the ADC. Thus, it is necessary to eliminate the low-pass RC filter.

The comparators that are described above are normally implemented using conventional auto-zero voltage comparators. An auto-zero voltage comparator generally requires a two-phase clock for auto-zeroing in the first phase and for actual signal comparison in the second phase. However, such two-phase design limits the maximum achievable operating frequency to a factor of two lower than otherwise possible, other factors being equal, if non-auto-zero voltage comparators are employed.

SUMMARY OF THE INVENTION

The present invention provides an analog-to-digital converter without a switch between the sample-and-hold circuit and the comparator. This eliminates the RC filter which forms a bottleneck between the sample-and-hold circuit and the rest of the ADC. As a consequence, the speed of the ADC can be increased.

DETAILED DESCRIPTION OF THE PRESENT INVENTION

Figure 4:
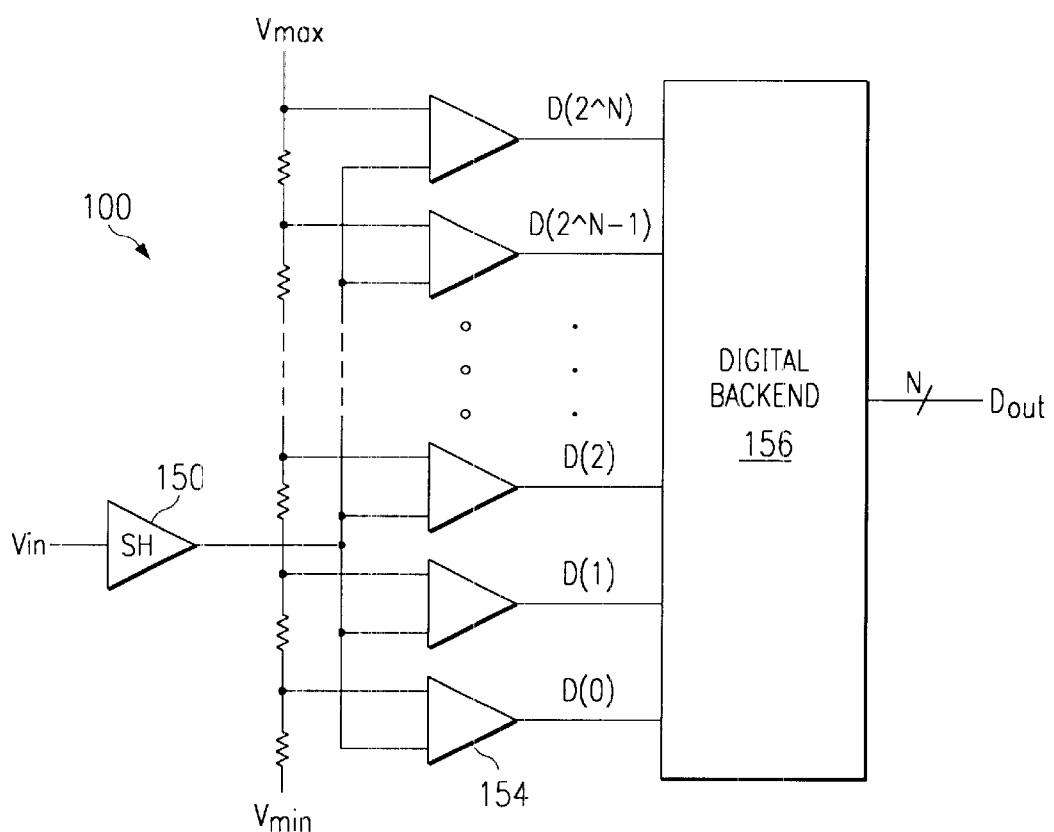
FIG. 4 illustrates an additional interface between the sample-and-hold circuit and a comparator.

An ADC of the present invention is illustrated in FIG. 4. The input of the ADC circuit 100 is illustrated by sample-and-hold circuit 150. The input signal is sampled and held by the sample-and-hold circuit 150. The output from the sample-and-hold circuit 150 is input to the comparator array 154. The comparator array 154 converts the input signal from the sample-and-hold circuit 150 to a digital thermometer code. The output of the comparator array 154 is input to digital logic (not shown) which formats the digital output.

The sample-and-hold circuit 150 can be either single-ended or differential.

Figure 1:
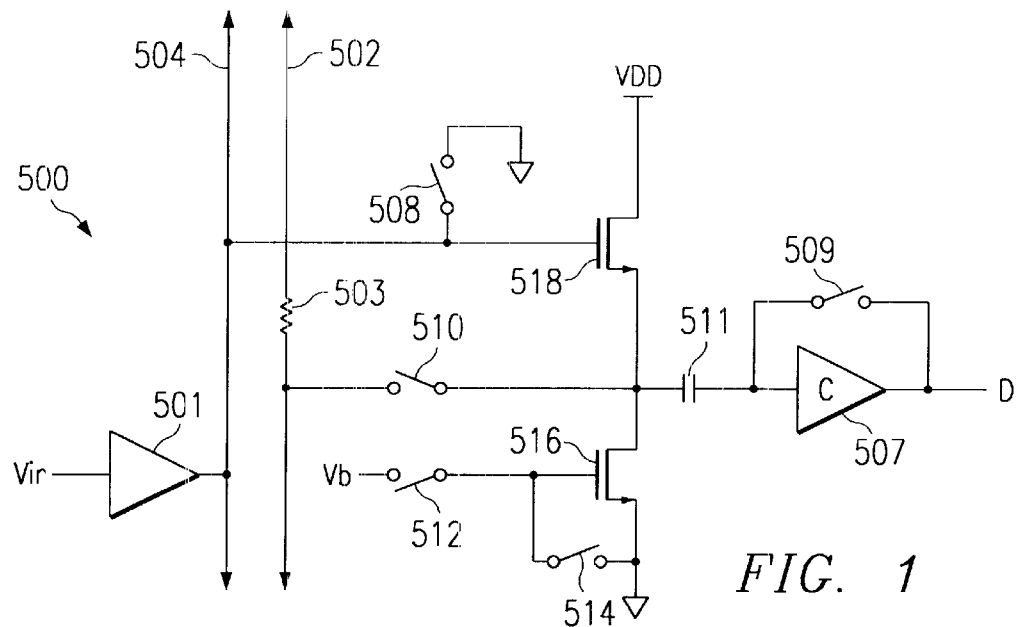
FIG. 1 illustrates a circuit diagram in accordance with the present invention.

FIG. 1 illustrates the apparatus of the improved comparator design.

The input voltage is input to sample-and-hold circuit 501 which outputs the input signal to bus 504. The sample-and-hold circuit 501 holds the input signal after the input signal is sampled and outputs the held signal. Additionally, a resistance ladder 502 is biased by a reference voltage through a series of resistors to produce a plurality of reference voltages. One such resistor of the resistance ladder 502 is illustrated as element 503. Connected to the input bus 504 is switch 508 and transistor 518. Connected to the resistance ladder 502 at one end of resistor 503 is switch 510, which is connected to transistors 518 and 516. Additionally, the switch 510 is connected to capacitor 511, which is shown as capacitor 1704 in FIG. 5. Connected to voltage $V_b$ is switch 512 which is additionally connected to switch 514. The switch 512 is connected to the gate of transistor 516 as well as the switch 514. The drain of transistor 518 is connected to voltage $V_{DD}$. The gate of transistor 518 is connected to the input bus 504 as well as switch 508. The source of transistor 518 is connected to transistor 516. Transistors 516 and 518 are illustrated in FIG. 1 as NEET transistors, but other types of transistors are used. The drain of transistor 516 is connected to the source of transistor 518. The gate of transistor 516 is connected to switch 512, and the source of transistor 516 is connected to switch 514. During normal operation, switches 508, 510 and 514 are turned off. Transistors 518 and 516 form a buffer from the input bus 504 to the capacitor 501 to buffer the held signal, and there is no series switch in the input path.

As described above, during the auto-zero cycle, the comparator 507 has an output connected to the input of the comparator 507 through switch 509. During the auto-zero cycle, switch 509 is closed to provide this connection. The capacitor 511 is connected to the resistance ladder through switch 510. During an auto-zero cycle switches 508 and 514 are closed which turns off transistors 516 and 518, effectively turning off the buffer. The reference voltage and any offset voltage of comparator 507 are now stored on to capacitor 511.

Figure 2:
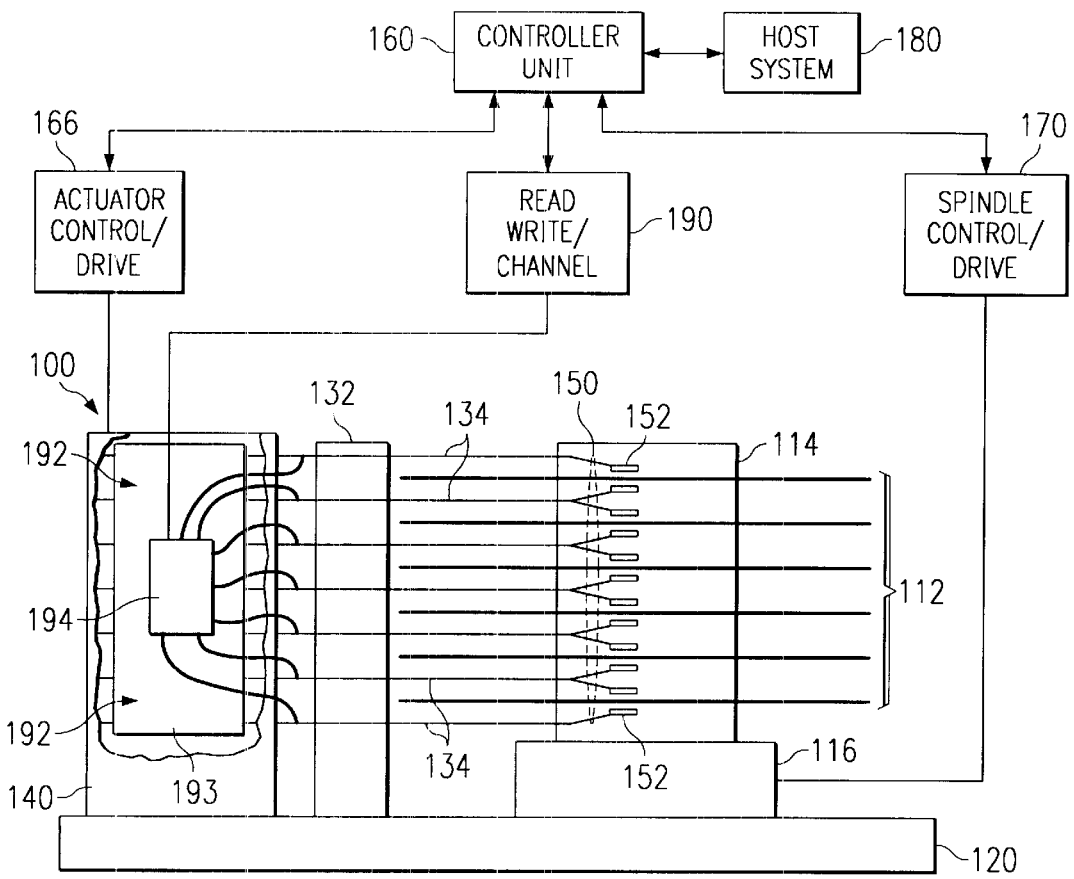
FIG. 2 illustrates a side view of a magnetic disk system.
Figure 3:
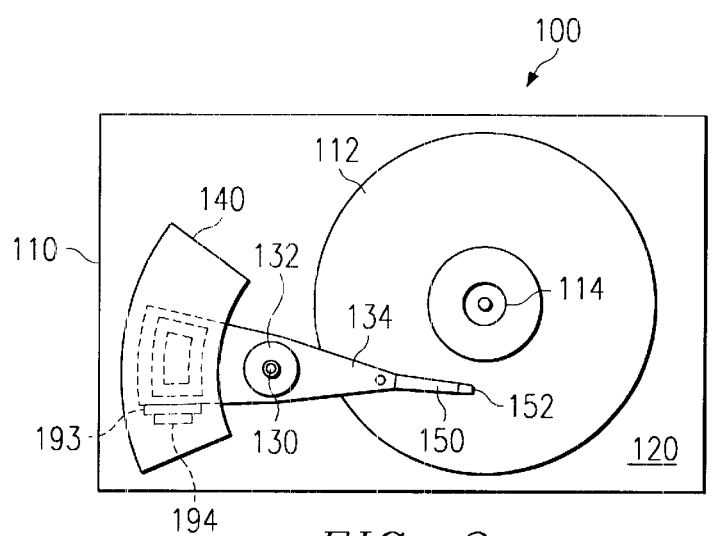
FIG. 3 illustrates a top view of a magnetic disk system.

FIGS. 2 and 3 show a side and top view, respectively, of the disk drive system designated by general reference 100 within enclosure 110. The disk drive system 100 includes a plurality of stacked magnetic recording disks 112 mounted to a spindle 114.

The disks 112 may be conventional particulate or thin-film recording disk or another embodiment. They may be liquid-bearing disks. The spindle 114 is attached to spindle motor 116 which rotates the spindle 114 and disks 112. A chassis 120 is connected to the enclosure 110 providing stable mechanical support for the disk drive system. The spindle motor 116 and the actuator shaft 130 are attached to the chassis 120. A hub assembly 113 rotates about the actuator shaft 130 and supports a plurality of actuator arms 134. The stack of actuator arms 134 is sometimes referred to as a "comb." A rotary voice coil motor 140 is attached to the chassis 120 and to the rear portion of the actuator arms 134.

A plurality of head suspension assemblies 150 is attached to the actuator arms 134. A plurality of inductive transducer heads 152 is attached respectively to the suspension assemblies 150, each head 152 including at least one inductive write elements. In addition thereto, each head 152 may also include an inductive read element or a MR (magneto-resistive) read element. The heads 152 are positioned proximate to the disks 112 by suspension assemblies 150 so that during operation, the heads are in electromagnetic communication with the disks 112. The rotary voice coil motor 140 rotates the actuator arms 134 about the actuator shaft 130 in order to move the head suspension assemblies 150 to the desired radial position on disks 112.

A controller unit 160 provides overall control to the disk drive system 100, including rotation control of the disks 112 and position control of the heads 152. The controller unit 160 typically includes (not shown) a central processing unit (CPU), a memory unit and other digital circuitry, although it should be apparent that these aspects could also be enabled as hardware logic by one skilled in the computer arts. Controller unit 160 is connected to the actuator control/drive unit 166 which is in turn connected to the rotary voice coil motor 140. A host system 180, typically a computer system or personal computer (PC), is connected to the controller unit 160. The host system 180 may send digital data to the controller unit 160 to be stored onto the disks, or it may request that digital data at a specified location be read from the disks 112 and sent back to the host system 180. A read/write channel 190 is coupled to receive and condition read and write signals by processing the signals generated by the controller unit 160 and communicate them to an arm electronics (AE) unit shown generally at 192 through a cut-away portion of the voice coil motor 140. The AE unit 192 includes a printed circuit board 193, or a flexible carrier, mounted on the actuator arms 134 or in close proximity thereto, and an AE module 194 mounted on the printed circuit board 193 or carrier that comprises circuitry preferably implemented in an integrated circuit (IC) chip including read drivers, write drivers, and associated control circuitry. The read/write channel 190 reads analog data from the magnetic disks. This analog data represents digital data, and consequently, one function of the read/write channel 190 is to convert the analog data to digital data. It is this connection with which the present invention is concerned. The read/write channel 190 includes an ADC to convert the analog data to digital data, and the portions are herein disclosed in more detail.

Figure 5:
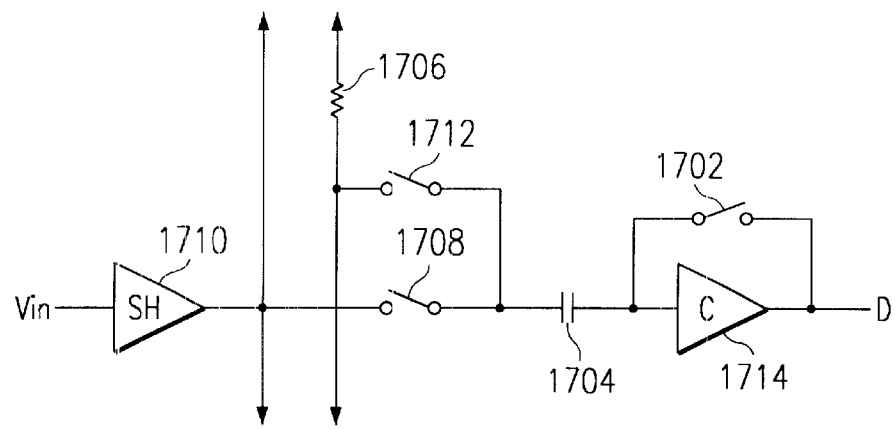
FIG. 5 illustrates a flash ADC.

The capacitive load on the sample-and-hold circuit 502 in FIG. 1 is much less than the load on the sample-and-hold circuit 1710 in the original design shown in FIG. 5. Therefore, the power used by the sample-and-hold circuit 502 in FIG. 1 is greatly reduced. This compensates for the increase in power used by transistors 518 and 516 in FIG. 1.

Transistors 516 and 518 in FIG. 1 form a tristate buffer. Other designs for analog tristate buffers could also be used.

A problem that still exists on the circuit of FIG. 1, is the offset voltage of the tristate buffer. This offset is not cancelled by the autozero operation.

Figure 6:
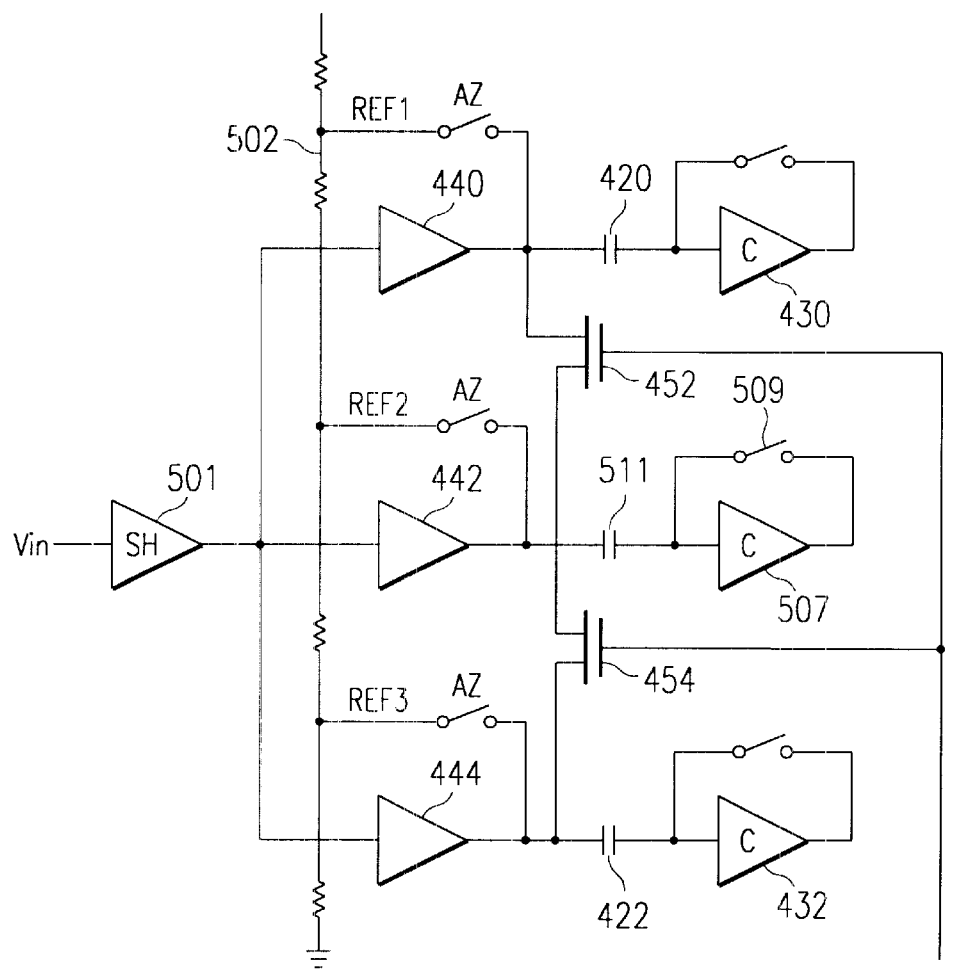
FIG. 6 illustrates a circuit of remove offset voltage.

FIG. 6 illustrates a circuit to remove the offset voltages of the buffers. As illustrated, switches 452 and 454 which are illustrated as MOSFET transistors, are used to eliminate the offset voltages between the buffers 440, 442 and 444. During the autozero operation, switches 452 and 454 are turned off, allowing capacitors 420, 511 and 422 to be charged to a different reference voltage. During normal operation switches 452 and 454 turned on. This effectively shorts the outputs of buffers 440, 442 and 444 together, thus minimizing the effect of any offsets between them.

Although the invention has been described and illustrated with reference to specific embodiments, it is not intended that the invention be limited to those illustrative embodiments. Those skilled in the art will recognize that modifications and variations may be made without departing from the spirit and scope of the invention.

What is claimed is:

1. An analog-to-digital converter to convert an analog signal to a digital signal, comprising:

a sample-and-hold circuit to sample and hold said analog signal and to output a held signal;

a buffer circuit to buffer said held signal to output a buffered signal;

a comparator circuit connected to said buffer circuit to compare said buffered signal with a reference voltage; and a switch connecting the input of said comparator circuit to a reference voltage, wherein said buffer circuit is a two-transistor circuit including a source follower transistor and a current source transistor.

2. An analog-to-digital converter to convert an analog signal to a digital signal, comprising:

a sample-and-hold circuit to sample and hold said analog signal and to output a held signal;

a buffer circuit to buffer said held signal to output a buffered signal;

a comparator circuit connected to said buffer circuit to compare said buffered signal with a reference voltage; and a switch connecting the input of said comparator circuit to a reference voltage, wherein said buffer circuit is an analog tristate.

3. An analog-to-digital converter to convert an analog signal to a digital signal, comprising:

a sample-and-hold circuit to sample and hold said analog signal and to output a held signal;

a buffer circuit to buffer said held signal to output a buffered signal;

a comparator circuit connected to said buffer circuit to compare said buffered signal with a reference voltage; and a switch connecting the input of said comparator circuit to a reference voltage, wherein said buffer circuit is an FET having a gate connected to said sample-and-hold circuit.

4. A disk system to read and write information, comprising:
- a head to read or write said information;
- a read channel circuit to process said information; and
- a controller to receive said information from said read channel;
- wherein said read channel includes:
  - an analog-to-digital converter (ADO) to convert an analog signal to a digital signal, said ADO including:
    - a sample-and-hold circuit to sample and hold said analog signal and to output a held signal;
    - a buffer circuit to buffer said held signal to output a buffered signal;
    - a comparator circuit connected to said buffer circuit to compare said buffered signal with a reference voltage; and
    - a switch connecting the input of said comparator to a reference voltage,
  - wherein said buffer circuit includes a source follower transistor and a current source transistor.

5. A disk system to read and write information, comprising:
- a head to read or write said information;
- a read channel circuit to process said information; and
- a controller to receive said information from said read channel;
- wherein said read channel includes:
  - an analog-to-digital converter (ADC) to convert an analog signal to a digital signal, said ADO including:
    - a sample-and-hold circuit to sample and hold said analog signal and to output a held signal;
    - a buffer circuit to buffer said held signal to output a buffered signal;
    - a comparator circuit connected to said buffer circuit to compare said buffered signal with a reference voltage; and
    - a switch connecting the input of said comparator to a reference voltage,
  - wherein said buffer circuit is an analog tristate.

6. A disk system to read and write information, comprising:
- a head to read or write said information;
- a read channel circuit to process said information; and
- a controller to receive said information from said read channel;
- wherein said read channel includes:
  - an analog-to-digital converter (ADO) to convert an analog signal to a digital signal, said ADO including:
    - a sample-and-hold circuit to sample and hold said analog signal and to output a held signal;
    - a buffer circuit to buffer said held signal to output a buffered signal;
    - a comparator circuit connected to said buffer circuit to compare said buffered signal with a reference voltage; and
    - a switch connecting the input of said comparator to a reference voltage,
  - wherein said buffer circuit is an FET having a gate connected to said sample-and-hold circuit.

7. A disk system as in claim 6, wherein said FET includes a source connected to said comparator.

* * * * *